(12) United States Patent
Huang et al.

(10) Patent No.: US 10,064,306 B2
(45) Date of Patent: Aug. 28, 2018

(54) BRACKET AND EQUIPMENT RACK

(71) Applicant: Wistron Corporation, New Taipei (TW)

(72) Inventors: Chin-Luang Huang, New Taipei (TW); Hung-Lung Lin, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 99 days.

(21) Appl. No.: 14/883,616

(22) Filed: Oct. 14, 2015

(65) Prior Publication Data

US 2016/0219749 A1 Jul. 28, 2016

(30) Foreign Application Priority Data

Jan. 26, 2015 (TW) .............................. 104201239 U (51) Int. Cl.
*H05K 7/14* (2006.01)

(52) U.S. Cl.
CPC ................................. *H05K 7/1489* (2013.01)

(58) Field of Classification Search
CPC ....... A47B 88/43; A47B 88/044; A47B 96/06; A47B 96/1441; H05K 7/1489; H05K 7/183; H05K 7/1421; H05K 7/1409
See application file for complete search history.

(56) References Cited

U.S. PATENT DOCUMENTS

| | | | | |
|---|---|---|---|---|
| 6,659,577 B2 * | 12/2003 | Lauchner | ............... | A47B 88/43 312/223.1 |
| 7,093,725 B2 * | 8/2006 | Hartman | ................. | G06F 1/183 211/192 |
| 7,357,362 B2 * | 4/2008 | Yang | ...................... | A47B 88/43 248/220.22 |
| 7,641,297 B2 * | 1/2010 | Huang | ................. | H05K 7/1489 211/26 |
| 7,699,279 B2 * | 4/2010 | Chen | ..................... | A47B 88/43 248/220.22 |
| 7,703,734 B2 * | 4/2010 | Chen | ..................... | A47B 88/43 108/108 |
| 7,950,753 B2 * | 5/2011 | Liang | .................... | A47B 88/43 211/26 |
| 7,988,246 B2 * | 8/2011 | Yu | .......................... | A47B 88/43 211/175 |
| 8,104,626 B2 * | 1/2012 | Huang | ................... | A47B 88/43 211/26 |

(Continued)

*Primary Examiner* — Patrick D Hawn
(74) *Attorney, Agent, or Firm* — Winston Hsu (57) ABSTRACT

An equipment rack includes two rack rails and a bracket. The bracket includes a bracket body and a first and a second connection device disposed at the bracket body's ends. The first connection device includes a rod part extending outward relative to the bracket body. An engaging section and a supporting section are formed on the rod part in the extending direction of the rod part. The engaging section is between the supporting section and the bracket body. The bracket is installed on one rack rail by the supporting section being inserted into a hole of said rack rail and is installed on the other rack rail by the second connection device engaging with the other rack rail. The bracket body is operable to move relative to the rack rails so that the engaging section enters the hole and the second connection device is disengaged from the rack rail.

18 Claims, 10 Drawing Sheets

(56) References Cited

U.S. PATENT DOCUMENTS

| | | | | |
|---|---|---|---|---|
| 8,353,494 B2* | 1/2013 | Peng | A47B 88/43 | 211/192 |
| 8,371,454 B2* | 2/2013 | Chen | H05K 7/1421 | 211/26 |
| 8,408,506 B2* | 4/2013 | Yu | A47B 88/43 | 248/219.1 |
| 8,602,225 B2* | 12/2013 | Lin | A47B 88/43 | 211/26 |
| 8,727,138 B2* | 5/2014 | Dittus | H05K 7/1489 | 211/26 |
| 8,770,528 B2 | 7/2014 | Chen | | |
| 8,807,351 B2* | 8/2014 | Lin | A47B 88/43 | 211/26 |
| 8,967,565 B2* | 3/2015 | Chen | A47B 88/044 | 211/192 |
| 9,125,489 B2* | 9/2015 | Chen | A47B 88/044 | |
| 9,370,120 B2* | 6/2016 | Chen | A47B 96/025 | |
| 9,375,087 B1* | 6/2016 | Chen | A47B 88/43 | |
| 2004/0104184 A1* | 6/2004 | Hartman | G06F 1/183 | 211/26 |
| 2005/0155941 A1* | 7/2005 | Hartman | G06F 1/183 | 211/26 |
| 2005/0156493 A1* | 7/2005 | Yang | A47B 88/43 | 312/334.5 |
| 2005/0189855 A1* | 9/2005 | Naue | A47B 88/43 | 312/334.4 |
| 2005/0285492 A1* | 12/2005 | Hu | A47B 88/43 | 312/334.4 |
| 2008/0067907 A1* | 3/2008 | Chen | A47B 88/43 | 312/312 |
| 2008/0122333 A1* | 5/2008 | Tseng | A47B 88/493 | 312/333 |
| 2008/0296455 A1* | 12/2008 | Brock | A47B 96/06 | 248/298.1 |
| 2009/0114785 A1* | 5/2009 | Huang | A47B 88/43 | 248/220.31 |
| 2009/0166485 A1* | 7/2009 | Chen | A47B 88/43 | 248/200 |
| 2009/0167127 A1* | 7/2009 | Chen | A47B 88/43 | 312/334.1 |
| 2010/0072153 A1* | 3/2010 | Chen | H05K 7/1421 | 211/183 |
| 2012/0076446 A1* | 3/2012 | Chen | A47B 88/43 | 384/21 |
| 2012/0292274 A1* | 11/2012 | Lin | A47B 88/43 | 211/86.01 |
| 2014/0363108 A1* | 12/2014 | Chen | A47B 88/044 | 384/22 |
| 2014/0363109 A1* | 12/2014 | Chen | A47B 88/044 | 384/22 |

* cited by examiner

BRACKET AND EQUIPMENT RACK

BACKGROUND OF THE INVENTION

1. Field of the Invention

The invention relates to an equipment rack and a bracket therefor, and especially relates to an equipment rack with detachable brackets and a bracket therefor.

2. Description of the Prior Art

Conventional equipment racks include a plurality of rack rails disposed vertically and a plurality of brackets disposed horizontally for supporting devices disposed thereon. Therein, the disposition of the bracket can be vertically adjusted by request, for example according to the height of the device. In general, the rack rails of the equipment rack are fixedly disposed; that is, the intervals among the rack rails are fixed. For firmly installing the devices on the rack rails, the brackets of the equipment rack are usually provided with a fixed length and are used only to the equipment rack. However, the intervals of the rack rails of various equipment racks are not the same. The brackets of the equipment rack are not exchangeable in principle. When one equipment rack has no available brackets, it will be inconvenient to use more brackets. For this problem, a bracket having a telescopic mechanism is available on the market. The bracket uses bracket bodies slidably engaged with each other for adjusting the whole length of the bracket so that the bracket can be fitted to rack rails with various intervals. Furthermore, the bracket includes holding mechanisms at two ends thereof so that the bracket can be firmly installed on the rack rails without influence of the adjustable feature of the telescopic mechanism. However, for a certain rigidity and stability of the bracket with the telescopic mechanism, the structure of the bracket is usually complicated and the whole bracket is thick and heavy, leading to a difficulty in reducing the manufacturing cost thereof. In addition, because the bracket has the holding mechanisms at the two ends, the bracket cannot be removed from the equipment rack unless the two holding mechanisms are disengaged from the rack rails at the same time, which is inconvenient for detaching the bracket.

SUMMARY OF THE INVENTION

An objective of the invention is to provide a bracket for use in an equipment rack. The bracket has a rod part with a longer length. The rod part can be inserted into a hole of a rack rail of the equipment rack for supporting the bracket. The rod part also provides a movement buffer for the bracket during an installation of the bracket on the rack rails of the equipment rack. Thereby, the bracket can be easily installed on the rack rails and is suitable for equipment racks of which the interval of the rack rails varies within a certain range.

The bracket of the invention is used in an equipment rack. The equipment rack includes a first rack rail and a second rack rail. The first rack rail has a hole. The bracket includes a bracket body, a first connection device, and a second connection device. The bracket body has a first end portion and a second end portion. The first connection device is disposed on the first end portion and includes a rod part protruding in an extension direction relative to the bracket body. An engaging section and a supporting section are formed on the rod part in the extending direction. The engaging section is located between the supporting section and the first end portion. The engaging section and the supporting section are capable of being inserted into the hole. The bracket is installed on the first rack rail by the supporting section of the rod part of the first connection device being inserted into the hole. The second connection device is disposed on the second end portion. The bracket is installed on the second rack rail by the second connection device being engaged with the second rack rail. After the bracket is installed on the first rack rail and the second rack rail, the bracket body is operable to move relative to the first rack rail and the second rack rail, so that the engaging section enters the hole and the second connection device is disengaged from the second rack rail. Compared with the prior art, the rod part of the bracket of the invention can not only be inserted into the first rack rail for supporting the bracket but also provide a movement buffer for the bracket during the installation. Therefore, the bracket can be easily installed and is suitable for equipment racks of which the interval of the rack rails varies within a certain range Another objective of the invention is to provide an equipment rack, of which a bracket has a rod part with a longer length. The rod part can be inserted into a hole of a rack rail of the equipment rack for supporting the bracket. The rod part also provides a movement buffer for the bracket during an installation of the bracket on the rack rails of the equipment rack. Thereby, the bracket can be easily installed on the rack rails and is suitable for equipment racks of which the interval of the rack rails varies within a certain range.

An equipment rack of the invention includes a first rack rail, a second rack rail, and a bracket. The first rack rail has a hole. The bracket includes a bracket body, a first connection device, and a second connection device. The bracket body has a first end portion and a second end portion. The first connection device is disposed on the first end portion and includes a rod part protruding in an extension direction relative to the bracket body. An engaging section and a supporting section are formed on the rod part in the extending direction. The engaging section is located between the supporting section and the first end portion. The engaging section and the supporting section are capable of being inserted into the hole. The bracket is installed on the first rack rail by the supporting section of the rod part of the first connection device being inserted into the hole. The second connection device is disposed on the second end portion. The bracket is installed on the second rack rail by the second connection device being engaged with the second rack rail. After the bracket is installed on the first rack rail and the second rack rail, the bracket body is operable to move relative to the first rack rail and the second rack rail, so that the engaging section enters the hole and the second connection device is disengaged from the second rack rail. Similarly, the rod part of the bracket of the equipment rack of the invention can not only be inserted into the first rack rail for supporting the bracket but also provide a movement buffer for the bracket during the installation. Therefore, the bracket can be easily installed and is suitable for equipment racks of which the interval of the rack rails varies within a certain range.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
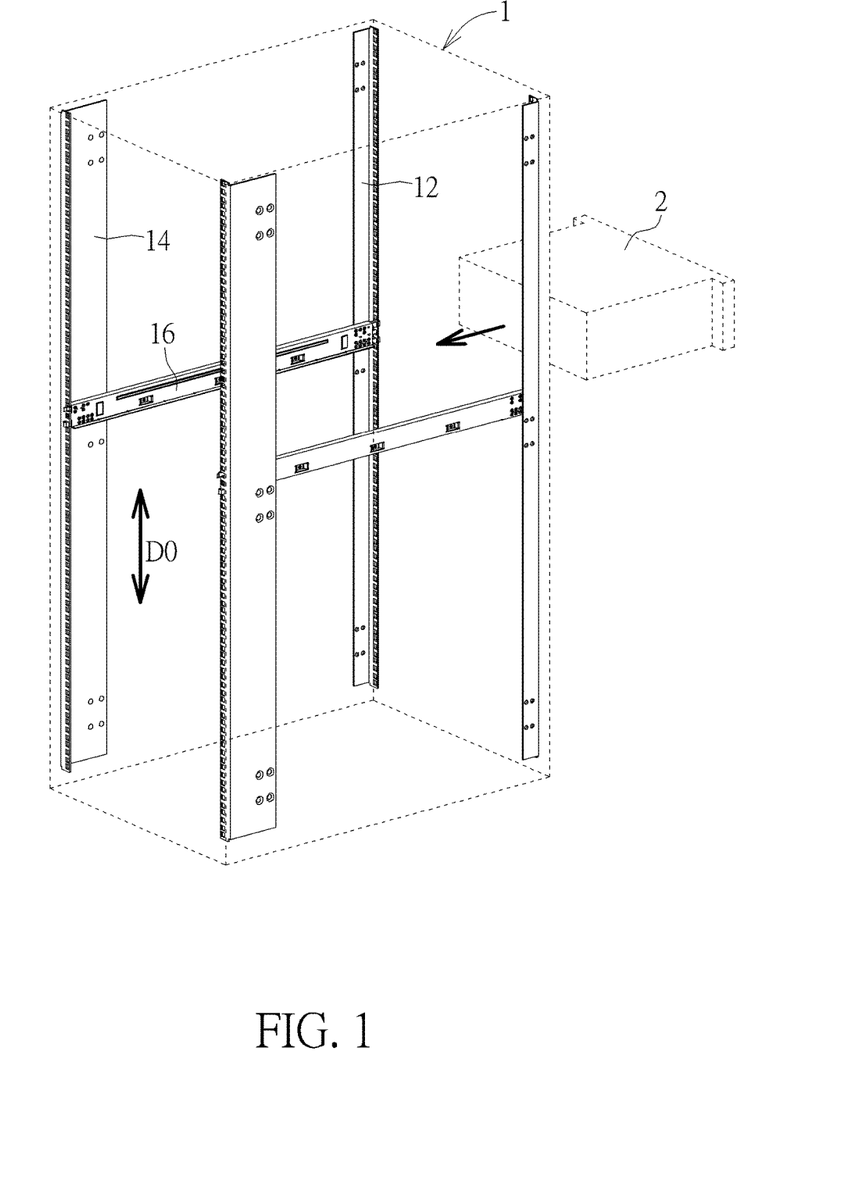
FIG. 1 is a schematic diagram illustrating an equipment rack of an embodiment according to the invention.

Please refer to FIG. 1 that is a schematic diagram illustrating an equipment rack 1 of an embodiment according to the invention. The equipment rack 1 is shown by its profile in dashed lines in FIG. 1. The equipment rack 1 includes a first rack rail 12 and a second rack rail 14 at one side, and a bracket 16 adjustably disposed on the first rack rail 12 and the second rack rail 14. The disposition of bracket 16 is adjustable in an extension direction (i.e. a vertical direction D0) of the first rack rail 12 and the second rack rail 14. In the embodiment, the equipment rack 1 includes other components substantially symmetrical to the above components at an opposite side; that is, the equipment rack 1 includes two rack rails and a bracket at the opposite side. Therefore, a device 2 (shown by its profile in dashed lines in FIG. 1) can be disposed on the two brackets. In practice, the equipment rack 1 is structurally symmetric at its two sides, but the invention is not limited thereto. For example, the bracket disposed at the opposite side is structurally different to the bracket 16.

Figure 2:
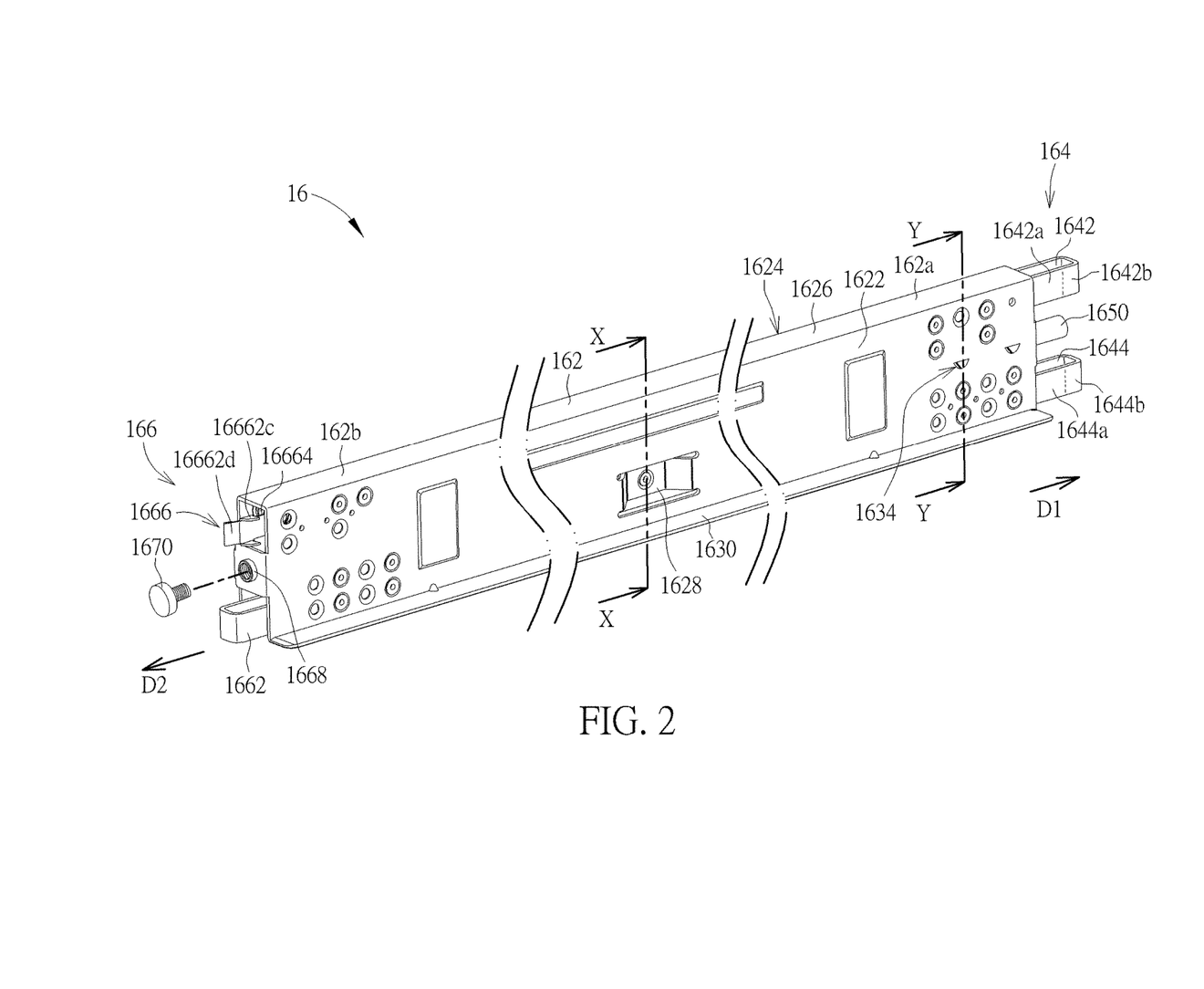
FIG. 2 is a schematic diagram illustrating a bracket of the equipment rack in FIG. 1.
Figure 3:
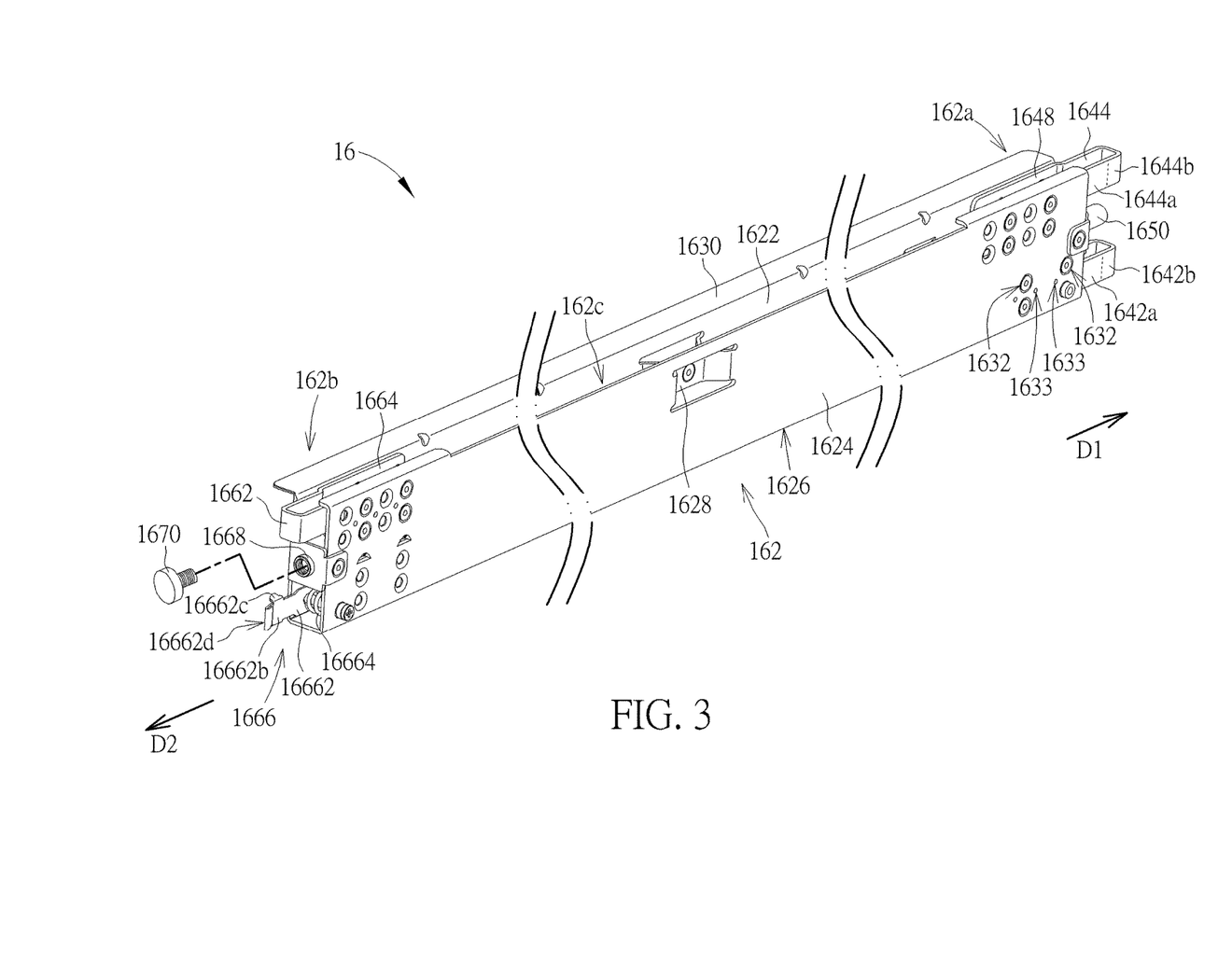
FIG. 3 is another schematic diagram illustrating the bracket in FIG. 2 in another view.
Figure 4:
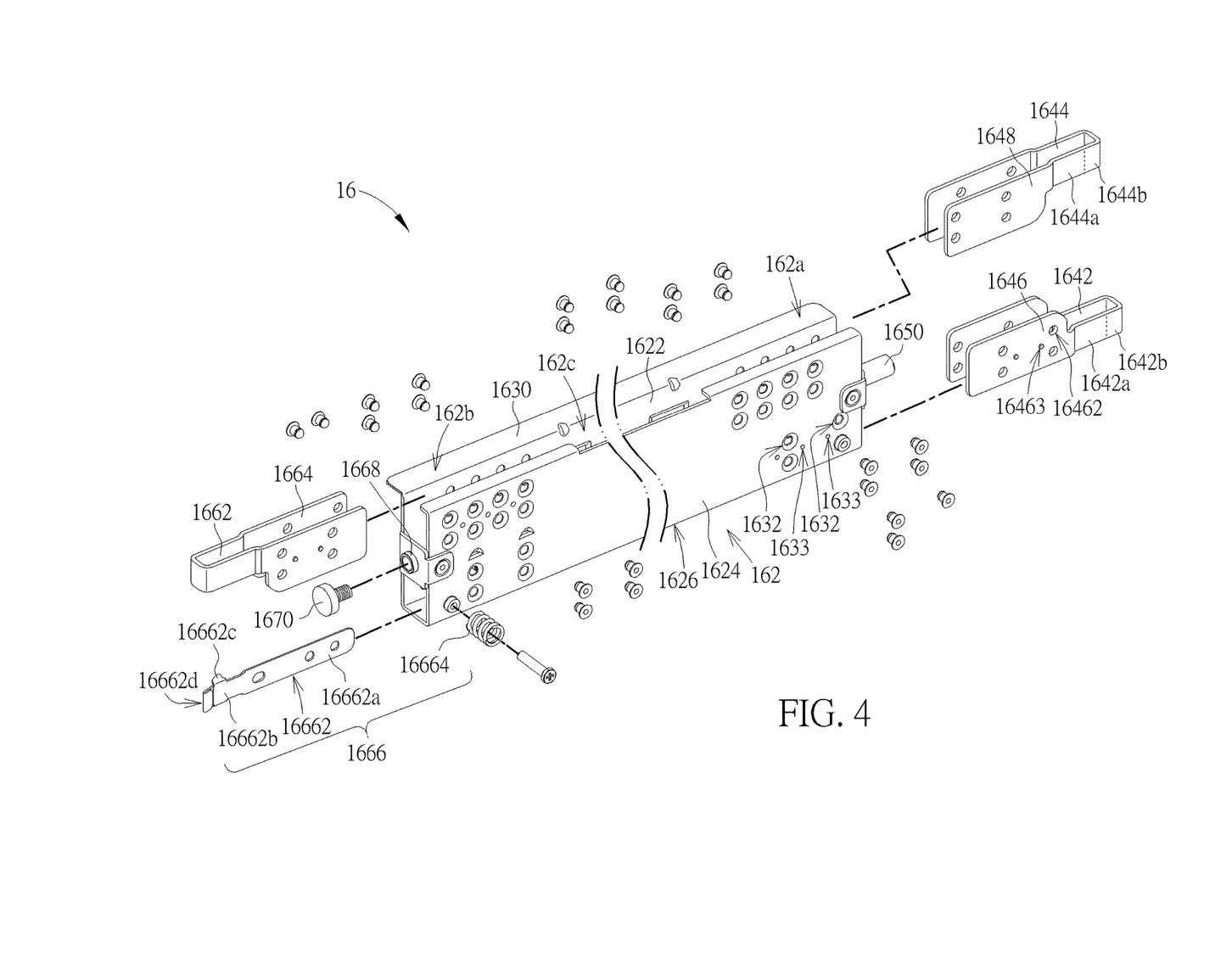
FIG. 4 is an exploded view of the bracket in FIG. 2.
Figure 5:
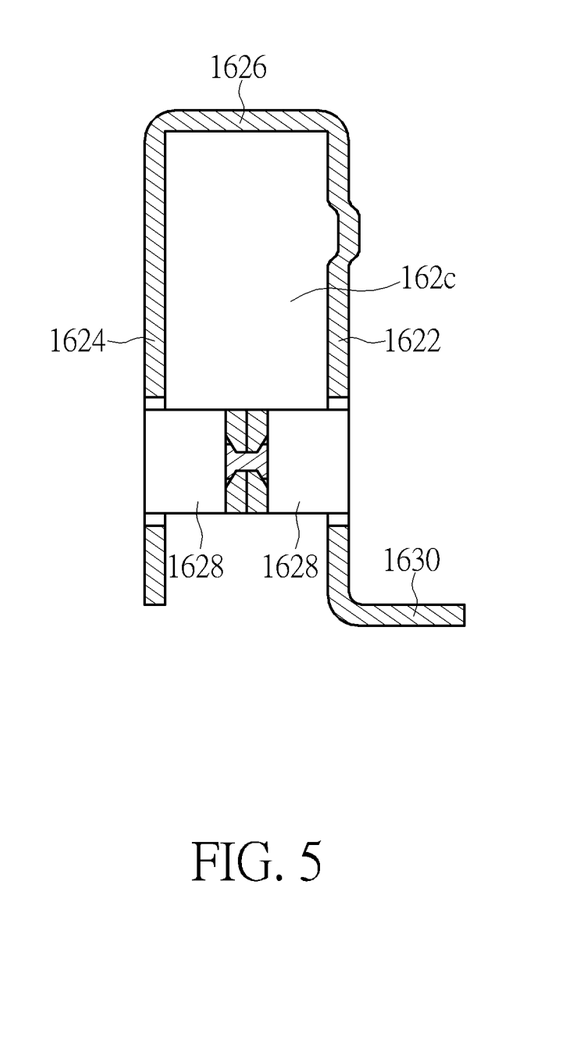
FIG. 5 is a sectional view of the bracket in FIG. 2 along the line X-X.

Please also refer to FIGS. 2 to 5. FIG. 2 is a schematic diagram illustrating the bracket 16. FIG. 3 is another schematic diagram illustrating the bracket 16 in another view. FIG. 4 is an exploded view of the bracket 16. FIG. 5 is a sectional view of the bracket 16 along the line X-X in FIG. 2. The bracket 16 includes a bracket body 162, a first connection device 164, and a second connection device 166. The bracket body 162 has a first end portion 162a and a second end portion 162b. The first connection device 164 is disposed on the first end portion 162a; the second connection device 166 is disposed on the second end portion 162b. Therefore, the bracket 16 is installed on the first rack rail 12 and the second rack rail 14 by the first connection device 164 and the second connection device 166 being engaged with the first rack rail 12 and the second rack rail 14 respectively. In the embodiment, the bracket body 162 is integrally formed by stamping a metal plate and is invariable in length. The bracket body 162 extends in a direction from the first end portion 162a toward the second end portion 162b. The bracket body 162 as a whole has an n-shaped section (as shown by FIG. 5). The bracket body 162 includes two side walls 1622 and 1624 and a top wall 1626. The two side walls 1622 and 1624 are oppositely disposed. The top wall 1626 is connected between the two side walls 1622 and 1624. The two side walls 1622 and 1624 and the top wall 1626 form an accommodating space 162c therebetween. Each of the two side walls 1622 and 1624 has a connecting supporting structure 1628 in the accommodating space 162c. The two protrusive connecting structures 1628 are fixedly connected to each other; that is, the two protrusive connecting structures 1628 protrude oppositely from the two side walls 1622 and 1624 respectively in the accommodating space 162c. In the embodiment, the two protrusive connecting structures 1628 are fixedly connected by a rivet connection. The fixed inter-connection of the connecting structures 1628 can enhance the whole rigidity of the bracket body 162. In practice, it is practicable for enhancing the whole rigidity of the bracket body 162 that only one protrusive connecting structure 1628 is disposed on one of the two side walls 1622 and 1624 and fixedly connects the two side walls 1622 and 1624. In the embodiment, the bracket body 162 further includes a carrying plate 1630 bent from the side wall 1622 and extending for supporting the device 2.

The first connection device 164 and the second connection device 166 are accommodated in the accommodating space 162c at the first end portion 162a and the second end portion 162b respectively. Therein, the first connection device 164 includes two rod parts 1642 and 1644, two fixed portions 1646 and 1648 and a fixing rod 1650. The two rod parts 1642 and 1644 are fixedly connected to the two fixed portions 1646 and 1648 respectively. The two fixed portions 1646 and 1648 are accommodated in the accommodating space 162c and fixed on the bracket body 162, so that the two rod parts 1642 and 1644 protrude in a first extension direction D1 relative to the bracket body 162. The fixing rod 1650 is fixed on the first end portion 162a of the bracket body 162. The first connection device 164 is engaged with the first rack rail 12 by the two rod parts 1642 and 1644. When the device 2 is supported on the bracket body 162, the device 2 can be fixed on the fixing rod 1650 by a screw, for example by screwing a screw (not shown in the figures) into the fixing rod 1650 (e.g. a thread hole thereof). Lengths in which the two rod parts 1642 and 1644 protrude relative to the bracket body 162 (i.e. the lengths in which the two rod parts 1642 and 1644 are exposed out of the bracket body 162) depend on the positions of the two fixed portions 1646 and 1648 relative to the bracket body 162. For the fixed portion 1646, the bracket body 162 includes plurality of joining holes 1632 on the side wall 1624 at the first end portion 162a (as shown in FIG. 3). In principle, the fixed portion 1646 has a fixing hole 16462 that can be selectively aligned with one of the joining holes 1632 for fixing the fixed portion 1646 on the bracket body 162 for example by a rivet connection with a rivet. Thereby, the length in which the rod part 1642 protrudes relative to the bracket body 162 is adjustable. It is added that in the embodiment, in practice, the fixed portion 1646 and the first end portion 162a are joined with each other by more holes (e.g. holes formed on the side walls 1622 and 1624 and holes formed on two sides of the fixed portion 1646), which can further enhance the joint strength of the fixed portion 1646 with the first end portion 162a.

In addition, in the embodiment, for the alignment convenience of the joining holes 1632 with the fixing hole 16462, the bracket body 162 includes a positioning structure, e.g. a plurality of positioning slots 1633 on the side wall 1624 of the first end portion 162a. The fixed portion 1646 includes a positioning structure correspondingly, e.g. a protruding spot 16463. By the positioning structure of the bracket body 162 being engaged with the positioning structure of the fixed portion 1646, e.g. the protruding spot 16463 being selectively snapped in one of the positioning slot 1633, the fixing hole 16462 can be aligned with one of the joining holes 1632 quickly for joining the fixing hole 16462 with the joining hole 1632 (e.g. by a rivet connection with a rivet). In practice, the above positioning mechanism also can be performed by a case that the positioning structure of the fixed portion 1646 includes a plurality of positioning slots and the positioning structure of the bracket body 162 includes a protruding spot correspondingly. It is added that, in the embodiment, in practice, the fixed portion 1646 includes two protruding spots 16463 for being snapped in the positioning slots 1633, which can enhance the alignment stability of the fixing hole 16462 and the joining hole 1632, for example, preventing the fixed portion 1646 from rotating or moving relative to the first end portion 162*a* before the fixing hole 16462 is joined with the joining hole 1632. In addition, in the embodiment, the positioning slot 1633 is realized by a hole, but the invention is not limited thereto. For example, the positioning slot 1633 can be realized by a blind hole or any recess structure capable of performing a positioning effect. In the embodiment, the rod part 1642 and the fixed portion 1646 are integrally formed by stamping a metal plate, which applies to the rod part 1644 and the fixed portion 1648, but the invention is not limited thereto. Furthermore, in the embodiment, although the fixed portions 1646 and 1648 are disposed oppositely (i.e. by rotating 180 degrees relative to the first extension direction D1), they are structurally equal. Therefore, for the description of the fixed portion 1648 and the rod part 1644, please refer to the description of the fixed portion 1646 and the rod part 1644, which will not be repeated in addition. The embodiment uses the fixed portions 1646 and 1648 provided in the same structure, which can improve the component exchangeability and reduce the manufacturing cost.

Figure 6:
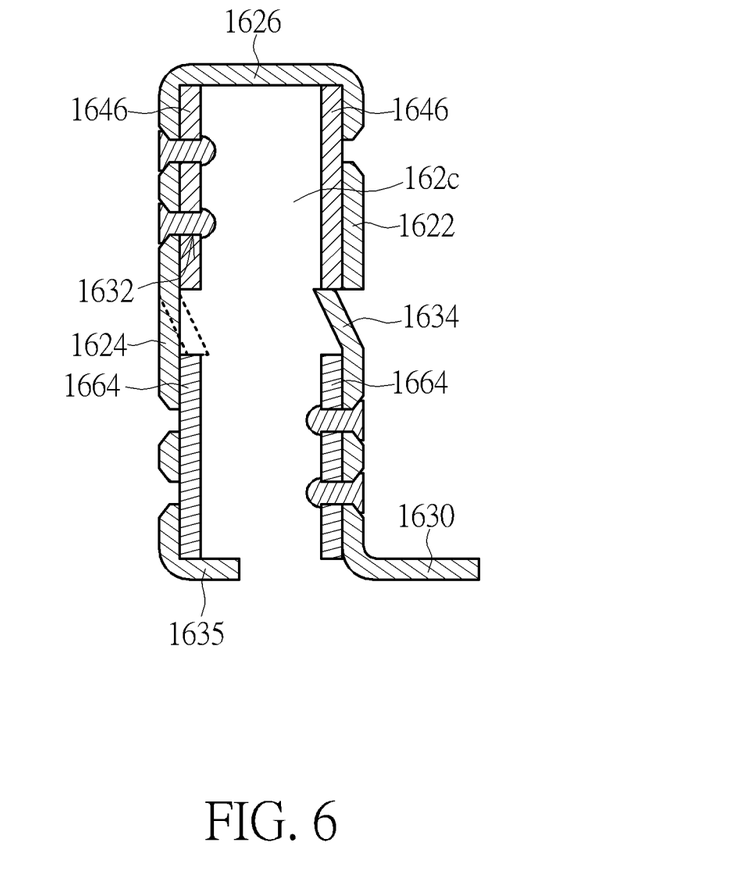
FIG. 6 is a sectional view of the bracket in FIG. 2 along the line Y-Y.
Figure 7:
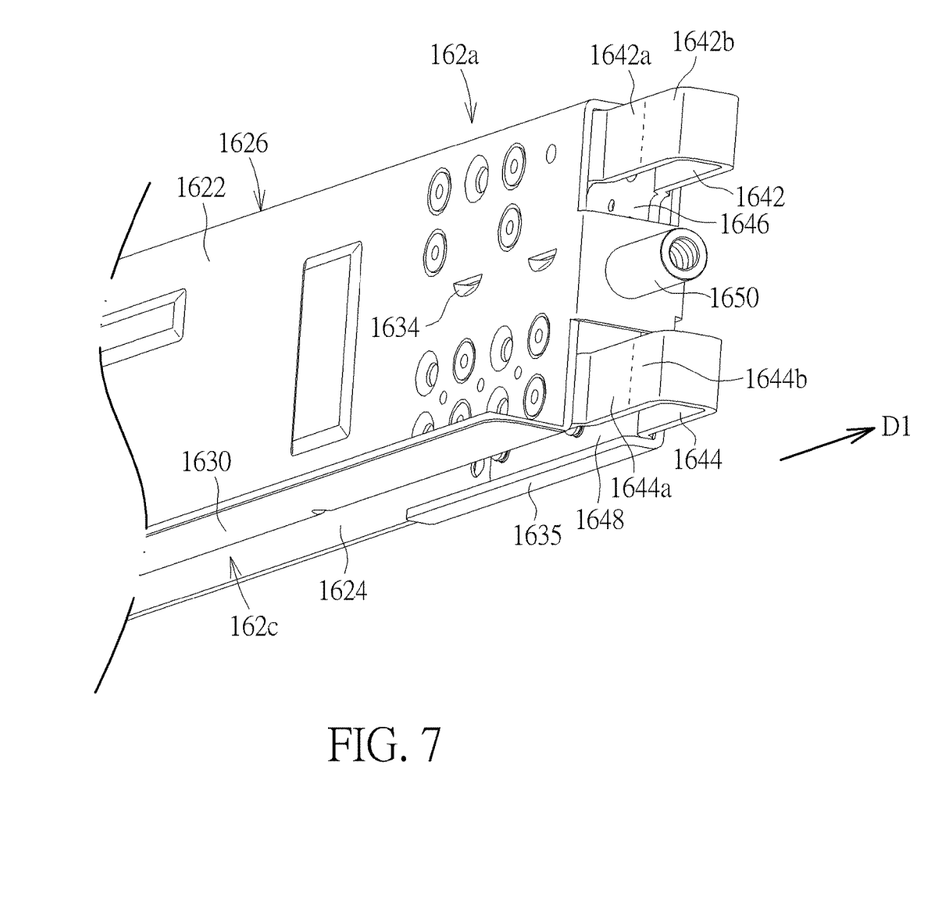
FIG. 7 is another schematic diagram illustrating a portion of the bracket in FIG. 2 in another view.

In addition, please also refer to FIG. 6 and FIG. 7. FIG. 6 is a sectional view of the bracket 16 along the line Y-Y in FIG. 2. FIG. 7 is another schematic diagram illustrating a portion of the bracket 16 in another view. The side wall 1622 has a protrusive supporting structure 1634 in the accommodating space 162*c*, i.e. a structure protruding from the side wall 1622 toward the interior of the bracket body 162. The fixed portion 1646 is located between the top wall 1626 and the protrusive supporting structure 1634. The protrusive supporting structure 1634 can be against a bottom surface of the fixed portion 1646 so that the protrusive supporting structure 1634 supports the fixed portion 1646, which is conducive to the alignment of the fixing hole 16462 with the joining hole 1632 before the fixed portion 1646 is joined with the bracket body 162. In the embodiment, the fixed portion 1646 is structurally constrained by the side walls 1622 and 1624, the top wall 1626, and the protrusive supporting structure 1634, which can enhance the stability of the rivet connection of the fixing hole 16462 with the joining hole 1632. In principle, it is practicable for the above structural stability effect that the protrusive supporting structure 1634 can be disposed on only one of the side walls 1622 and 1624. In practice, the side wall 1624 in the embodiment also can be provided with a protrusive supporting structure to form a symmetrical supporting with the above protrusive supporting structure 1634, which can perform the structural stability effect further. Moreover, in the embodiment, the structural constraint directly on the fixed portion 1646 by the side walls 1622 and 1624, the top wall 1626, and the protrusive supporting structure 1634 is also conducive to a stable force transfer. For example, the weight of the device 2 is partially transferred from the carrying plate 1630, the bracket body 162, the rivet connection of the fixing hole 16462 and the joining hole 1632, the fixed portion 1646 and the rod part 1642 to the first rack rail 12.

In addition, in the embodiment, the bracket body 162 further includes a bottom wall 1635 disposed opposite to the top wall 1626 and connected to the side wall 1624. The fixed portion 1648 is disposed between the bottom wall 1635 and the top wall 1626. The bottom wall 1635 is against a bottom surface of the fixed portion 1648 so that the bottom wall 1635 supports the fixed portion 1648, which is conducive to the alignment of the fixing hole of the fixed portion 1648 with the joining hole of the bracket body 162 at the first end portion 162*a* before the fixed portion 1648 is joined with the bracket body 162. Similarly, in the embodiment, the structural constraint directly on the fixed portion 1648 by the side walls 1622 and 1624 and the bottom wall 1635 is also conducive to a stable force transfer. For example, the weight of the device 2 is partially transferred from the carrying plate 1630, the bracket body 162, the rivet connection of the fixing hole of the fixed portion 1648 and the joining hole of the bracket body 162 at the first end portion 162*a*, the fixed portion 1648 and the rod part 1644 to the first rack rail 12. It is added that in practice, the side wall (e.g. the side wall 1624) can have a reverse supporting structure (as shown in dashed lines in FIG. 6) relative to the above protrusive supporting structure 1634 in the accommodating space 162*c*. The reverse supporting structure is against a top surface of the fixed portion 1648. Thereby, the reverse supporting structure, the side walls 1622 and 1624, and the bottom wall 1635 can structurally constrain the fixed portion 1648 at up and down, left and right sides directly, which can enhance the force transfer stability further.

The second connection device 166 includes a rod part 1662, a fixed portion 1664, and a resilient holding part 1666. The rod part 1662 is fixedly connected to the fixed portion 1664. The fixed portion 1664 is disposed in the accommodating space 162*c* and fixed on the bracket body 162, so that the rod part 1662 protrudes in a second extension direction D2 relative to the bracket body 162. In the embodiment, the second extension direction D2 is opposite to the first extension direction D1, but the invention is not limited thereto. The length in which the rod part 1662 protrudes relative to the bracket body 162 (i.e. the length of the rod part 1662 exploded out of the bracket body 162) depends on the disposition of the fixed portion 1664 relative to the bracket body 162. In the embodiment, the joint of the fixed portion 1664 with the bracket body 162 is equal to that of the fixed portion 1646 with the bracket body 162. Therefore, for the joint of the fixed portion 1664 with the bracket body 162, please refer to the description of the joint of the fixed portion 1646 with the bracket body 162, which will not be repeated in addition. Furthermore, in the embodiment, the rod part 1662 and the fixed portion 1664 are integrally formed by stamping a metal plate too. The length in which the rod part 1662 protrudes relative to the bracket body 162 is adjustable by request, like the lengths in which the rod parts 1642 and 1644 protrude relative to the bracket body 162. Therefore, in the embodiment, the three components, formed by the rod parts 1642, 1644 and 1662 with the fixed portions 1646, 1648 and 1664 respectively, are exchangeable with each other, which can improve the exchangeability among the three components and reduce their manufacturing cost.

The resilient holding part 1666 includes a cantilever part 16662 and an elastic part 16664. The cantilever part 16662 has a fixed end 16662*a* and a free end 16662*b*. The fixed end 16662*a* is disposed in the accommodating space 162*c* and fixed on the side wall 1622 of the second end portion 162*b* of the bracket body 162. The free end 16662*b* is connected to the fixed end 16662*a* and extends in the second extension direction D2 to protrude out of the bracket body 162. The elastic part 16664 (e.g. spring) is disposed between the cantilever part 16662 and the side wall 1624 of the bracket body 162 and applies a resilient force to the cantilever part 16662. In principle, the cantilever part 16662 can perform a resilient movement in a certain degree as the fixed end 16662a of the cantilever part 16662 is fixed on the bracket body 162. The elastic part 16664 (or any other structure capable of providing resilience) can improve the resilient force by the cantilever part 16662 for enhancing the movement stability and fatigue resistance of the resilient holding part 1666. The cantilever part 16662 includes a hook structure 16662c at the free end 16662b. The second connection device 166 is engaged with the second rack rail 14 by the rod part 1662 and the resilient holding part 1666; therein, the resilient holding part 1666 holds the second rack rail 14 by the hook structure 16662c.

Figure 8:
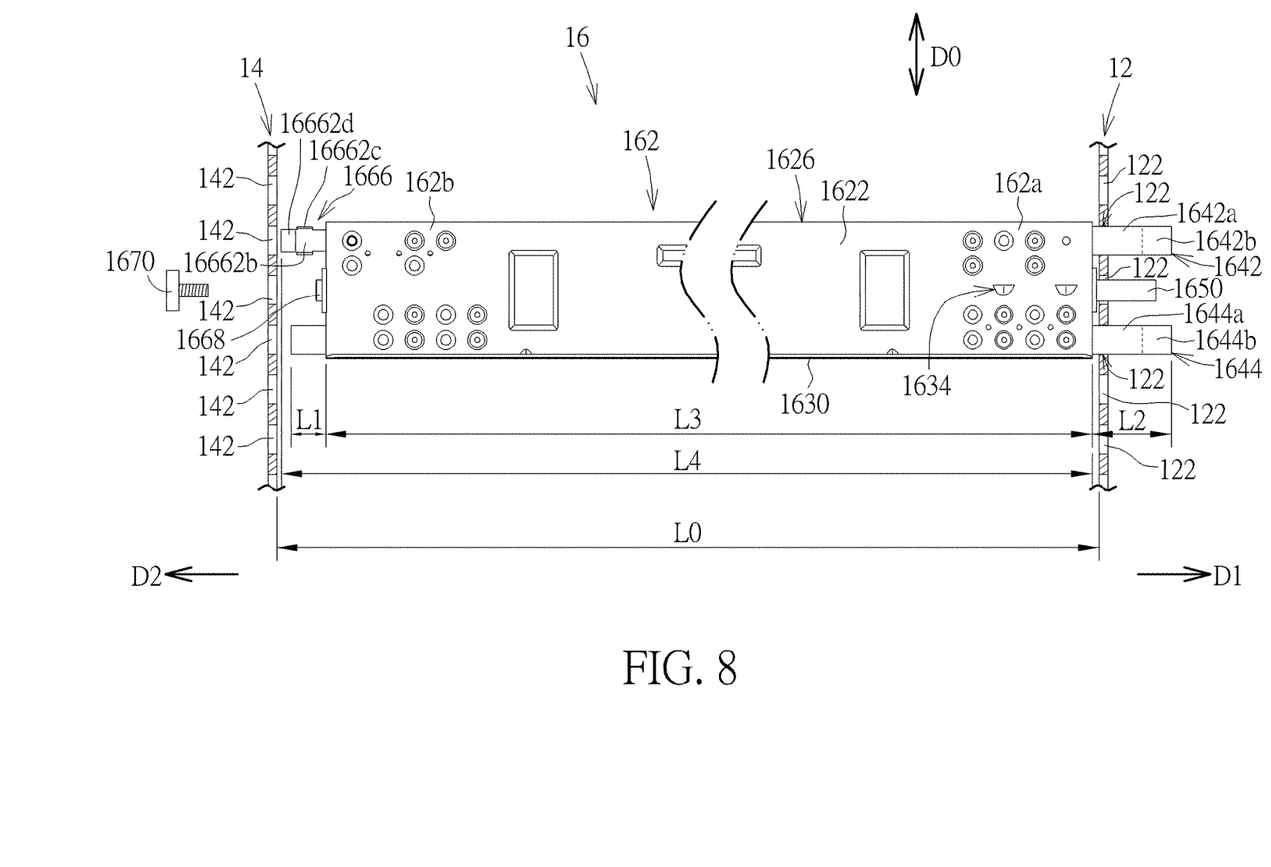
FIG. 8 is a schematic diagram illustrating the bracket in FIG. 2 of which a side is inserted into a rack rail of the equipment rack.
Figure 9:
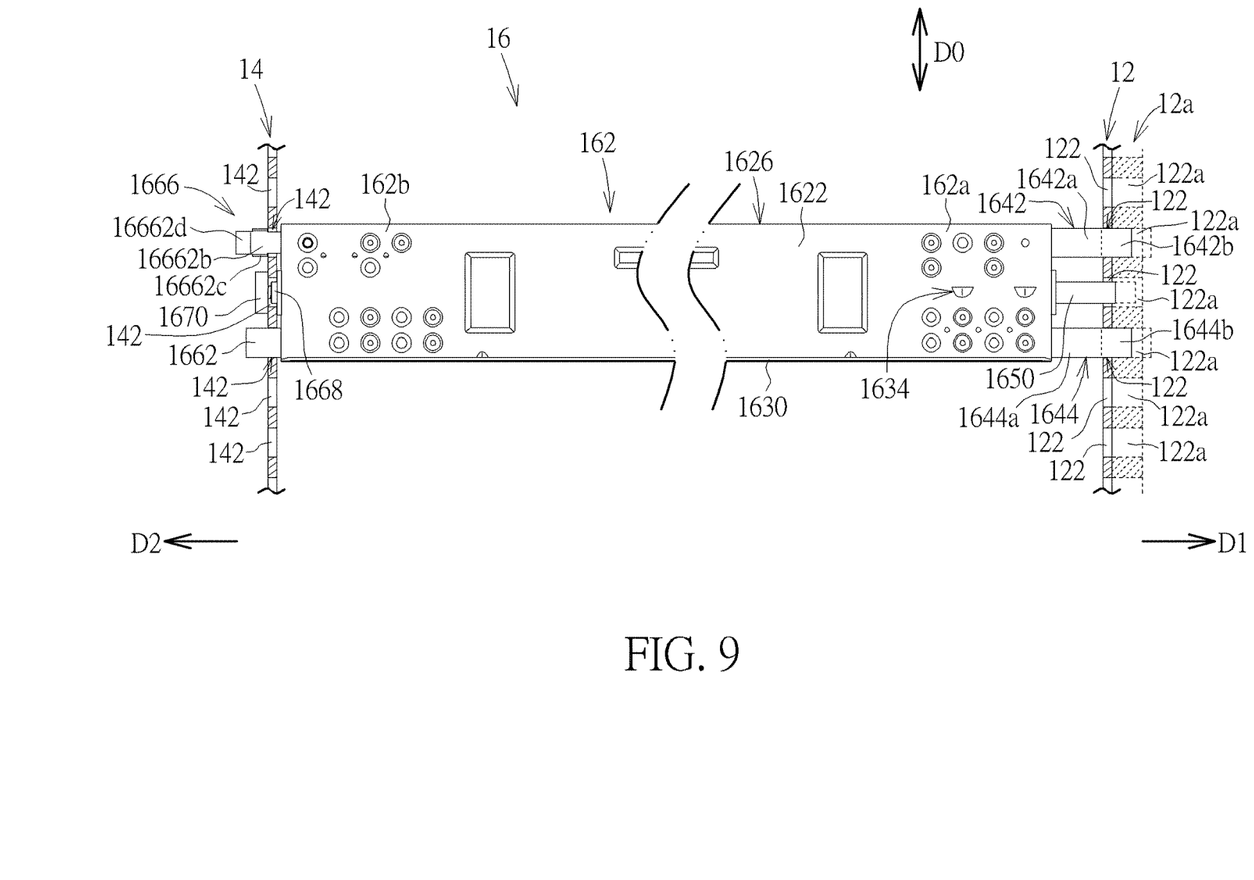
FIG. 9 is a schematic diagram illustrating the bracket in FIG. 2 after installed in equipment rack.

Please refer to FIG. 8 and FIG. 9. FIG. 8 and FIG. 9 are schematic diagrams illustrating installing the bracket 16 on the first rack rail 12 and the second rack rail 14; therein, the first rack rail 12 and the second rack rail 14 are shown in a sectional view. The first rack rail 12 has a plurality of holes 122. The second rack rail 14 also has a plurality of holes 142. An engaging section 1642a and a supporting section 1642b are formed on the rod part 1642 in the first extending direction D1. The engaging section 1642a is located between the supporting section 1642b and the first end portion 162a. Similarly, an engaging section 1644a and a supporting section 1644b are formed on the rod part 1644 in the first extending direction D1; the engaging section 1644a is located between the supporting section 1644b and the first end portion 162a. In an application, the portion of the rod part 1642 from the engaging section 1642a to the free end of the rod part 1642 can be defined as the supporting section 1642b, which also applies to the definition of the supporting section 1644b, but the invention is not limited thereto. when the bracket 16 is to be installed onto the first rack rail 12 and the second rack rail 14, the bracket body 162 is moved first so that the rod parts 1642 and 1644 of the first connection device 164 are selectively inserted into the holes 122 with the engaging sections 1642a and 1644a of the rod parts 1642 and 1644 being in the holes 122, as shown by FIG. 8. In the embodiment, the supporting sections 1642b and 1644b pass through the holes 122, but the invention is not limited thereto. For example, if the depth (or length) of the hole 122 is sufficient, the supporting sections 1642b and 1644b and the engaging sections 1642a and 1642a can also be located in the holes 122.

Afterward, the rod part 1662 of the second connection device 166 is substantially aligned with the hole 142 of the second rack rail 14, as shown by FIG. 8. Therein, the hole 142 with which the rod part 1662 is aligned corresponds to the holes 122 in which the rod parts 1642 and 1644 are inserted, so that the bracket 16 can be supported stably by the first rack rail 12 and the second rack rail 14. Then, the bracket body 162 is moved so that the engaging sections 1642a and 1642a departs from the holes 122, the supporting sections 1642b and 1644b are located in the holes 122, the rod part 1662 of the second connection device 166 is inserted into the hole 142 of the second rack rail 14, and the resilient holding part 1666 holds the second rack rail 14. Thereby, the bracket 16 is installed on the first rack rail 12 by the supporting sections 1642b and 1644b of the rod parts 1642 and 1644 of the first connection device 164 being inserted into the holes 122 and is installed on the second rack rail 14 by the second connection device 166 being engaged with the second rack rail 14 (including the rod part 1662 being inserted into the hole 142 and the resilient holding part 1666 holding the second rack rail 14), as shown by FIG. 9. It is added that in practice, a user can insert the two ends of the bracket 16 selectively into corresponding holes, for achieving an adjustment of the disposition of the bracket 16 in the vertical direction D0.

Figure 10:
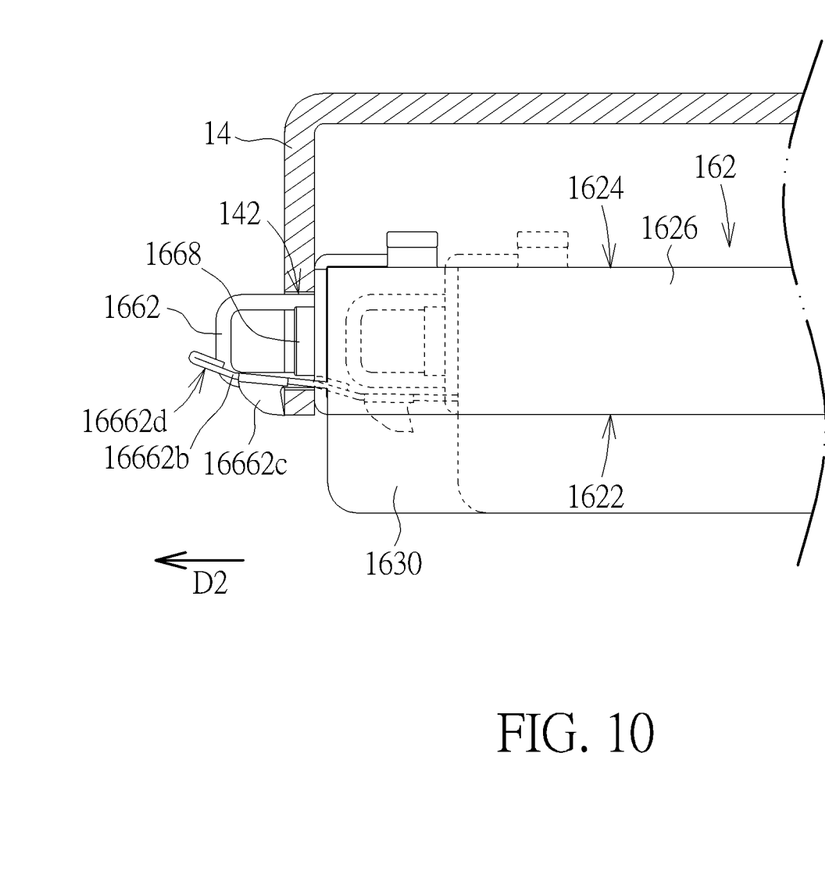
FIG. 10 is a schematic diagram in a top sectional view illustrating a second connection device of the bracket in FIG. 2 being engaged with another rack rail by a resilient holding part.

Please also refer to FIG. 10 that is a schematic diagram in a top sectional view illustrating the second connection device 166 being engaged with the second rack rail 14 by the resilient holding part 1666 holding the second rack rail 14. Therein, the second rack rail 14 is shown in a sectional view, and the profile in dashed lines represents the resilient holding part 1666 before engaged with the second rack rail 14. In the embodiment, the resilient holding part 1666 passes through another hole 142 by the free end 16662b and holds the second rack rail 14. Therein, the free end 16662b of the cantilever part 16662 includes a slanting surface 16662d. During the resilient holding part 1666 passing through the hole 142, the free end 16662b passes through the hole 142 by the hole 142 (or its edge) guiding the slanting surface 16662d and the hook structure 16662c is then spring back and holds the hole 142 (or the edge). In the embodiment, the resilient holding part 1666 passes through and holds the hole 142, but the invention is not limited thereto. For example, it is practicable for the effect of the second connection device 166 holding the second rack rail 14 that the hook structure 16662c of the resilient holding part 1666 holds the second rack rail 14 from the outside of the second rack rail 14. In addition, in the embodiment, the hook structure 16662c is a hook, so when the second connection device 166 is engaged with the second rack rail 14, the bracket 16 is fixed relative to the first extension direction D1 or the second extension direction D2 by the second rack rail 14 is held between the hook structure 16662c and the bracket body 162; however, the invention is not limited thereto. For example, the hook structure is realized by a slot so that the hook structure can hold the second rack rail by the slot independently, leading to the bracket 16 being fixed relative to the first extension direction D1 or the second extension direction D2.

After the installation of the bracket 16 onto the first rack rail 12 and the second rack rail 14 is completed, the engaging sections 1642a and 1644a are located between the bracket body 162 and the first rack rail 12. Because the rod parts 1642 and 1644 have a longer length, it is practicable that the bracket body 162 approaches the first rack rail 12 so that the rod part 1662 of the second connection device 166 can be horizontally aligned with the hole 142 of the second rack rail 14 and then inserted into the hole 142 with the rod parts 1642 and 1644 staying in the holes 122. In other words, after the bracket body 162 moves so that the second connection device 166 is engaged with the second rack rail 14, the supporting sections 1642b and 1644b are located in the holes 122 so that the purpose of the first rack rail 12 can support the bracket 16 by the rod parts 1642 and 1644. Therefore, the engaging sections 1642a and 1644a function as sliding buffer areas for the rod parts 1642 and 1644 during the movement of the bracket body 162 for engaging the second connection device 166 with the second rack rail 14; the supporting sections 1642b and 1644b function as areas for the rod parts 1642 and 1644 to be supported by the first rack rail 12. In the embodiment, the lengths of the engaging sections 1642a and 1644a are larger than the length L1 in which the rod part 1662 protrudes out of the bracket body 162, so the rod parts 1642 and 1644 provide insufficient sliding buffer areas. By setting the lengths of the supporting sections 1642b and 1644b (e.g. by adjusting the length L2, in which the rod parts 1642 and 1644 protrude out of the bracket body 162, by changing the positions of the fixed portions 1646 and 1648 relative to the bracket body 162), the bracket 16 can be suitable for equipment racks, of which the interval L0 between the first rack rail 12 and the second rack rail 14 varies within a certain range, and the rod parts 1642 and 1644 of the bracket 16 also can be adapted to holes provided with different depths. For example, as shown in FIG. 9, a case that the supporting sections 1642b and 1644b are elongated for being adapted to a thicker rack rail 12a (as shown in dashed lines in FIG. 9) that has deeper holes 122a (as shown in dashed lines in FIG. 9). Furthermore, in the embodiment, the bracket body 162 extends parallel to the first extension direction D1 and has a fixed length L3 in the direction from the first end portion 162a toward the second end portion 162b, so that the interval between the first connection device 164 and the second connection device 166 disposed on the first end portion 162a and the second end portion 162b respectively is invariable. Although the length of the entire bracket 16 is substantially invariable, i.e. the relative position of the first connection device 164 and the second connection device 166 being substantially incapable of being adjusted, the bracket 16 is still suitable for equipment racks, of which the interval L0 between the first rack rail 12 and the second rack rail 14 varies within a certain range, by setting the protrusive lengths L2 and L1 of the rod parts 1642, 1644 and 1662, as interpreted above. Compared with the prior art, the structure of the bracket body 162 is simpler, the bracket body 162 can have an enough rigidity and stability, and the manufacturing cost thereof is also lower.

Furthermore, in the embodiment, a length L4 from the distal end of the resilient holding part 1666 (or the distal end of the rod part 1662 if the distal end of the rod part 1662 is farther from the second end portion 162b) to the first end portion 162a (or the distal end of the bracket body 162 opposite to the second end portion 162b) is less than the interval L0 between the first rack rail 12 and the second rack rail 14. Therefore, when the engaging sections 1642a and 1644a of the rod parts 1642 and 1644 of the first connection device 164 are located in the holes 122, the rod part 1662 of the second connection device 166 and the resilient holding part 1666 can move to the place between the first rack rail 12 and the second rack rail 14 smoothly and be aligned with two of the holes 142 with which the rod part 1662 and the resilient holding part 1666 are then engaged (i.e. the rod part 1662 being inserted into one aligned hole 142 and the resilient holding part 1666 holds another aligned hole 142). In addition, in the embodiment, under a condition that the interval L0 between the first rack rail 12 and the second rack rail 14 is the same, the length L2 in which the rod part 1642 (or the rod part 1644) protrudes relative to the bracket body 162 is larger than the length L1 in which the rod part 1662 protrudes relative to the bracket body 162, so that the length L3 of the bracket body 162 can be designed to be as longer as possible relative to the interval L0 and the lengths of the engaging sections 1642a and 1644a can be designed to be as shorter as possible (just for the rod part 1662 to be aligned with the hole 142 in the second extension direction D2 and inserted into the hole 142).

After the installation of the bracket 16 onto the first rack rail 12 and the second rack rail 14 is completed, the user can perform the above installation operation in reverse order for detaching the bracket 16, for example for adjusting the disposition of the bracket 16 relative to the first rack rail 12 and the second rack rail 14 or for replacing with another bracket. Therein, the user can operate the resilient holding part 1666 not to hold the second rack rail 14. Then, the user can operate the bracket body 162 to move relative to the first rack rail 12 and the second rack rail 14 (i.e. moving right under the view of FIG. 8), so that the engaging sections 1642a and 1644a enters the hole 122 and the resilient holding part 1666 departs from the hole 142. At the moment, the second connection device 166 is disengaged from the second rack rail 14 (equal to the status shown by FIG. 8). The user can deflect the second connection device 166 from the second rack rail 14 and move the bracket body 162 so that the rod parts 1642 and 1644 are drawn out of the first rack rails 12. Therefore, the bracket 16 is disengaged from the first rack rail 12 and the second rack rail 14 totally, and the uninstallation of the bracket 16 is completed. For other description of the uninstallation of the bracket 16, please refer to the description of the installation operation of the bracket 16, which will not be repeated in addition.

It is added that in the embodiment, the rod parts 1642 and 1644 of the first connection device 164 are provided with a rectangular cross-section, so in practice, the function of supporting the bracket body 162 and preventing the bracket body 162 from rotating relative to the first rack rail 12 also can be performed by only one of the rod parts 1642 and 1644 being inserted into the hole 122 of the first rack rail 12. Furthermore, the second connection device 166 uses the resilient holding part 1666 to hole the second rack rail 14 and also uses the rod part 1662 to be inserted into the hole 142 for being supported on the second rack rail 14. In practice, the resilient holding part 1666 can be structurally integrated into the rod part 1662. For example, the resilient holding part 1666 is disposed in an open slot formed on the rod part 1662, or a partial structure of the rod part 1662 can be used to form a cantilever structure capable of functioning like the resilient holding part 1666.

It is added that in the embodiment, the second connection device 166 also includes a fixing rod 1668 and a screw part 1670. The fixing rod 1668 protrudes in the second extension direction D2 relative to the bracket body 162. When the rod part 1662 of the second connection device 166 is inserted into the hole 142 of the second rack rail 14, the fixing rod 1668 is exposed out of the hole 142. Then, the screw part 1670 can be screwed to the fixing rod 1668 so that the second end portion 162b is fixed relative to the second rack rail 14, leading to the engagement of the second connection device 166 with the second rack rail 14. Therein, in practice, the fixing rod 1668 can have an inner thread (e.g. a threaded hole) or an outer thread (e.g. a threaded bolt); the screw part 1670 can have an outer thread (e.g. a screw) or an inner thread (e.g. a nut) correspondingly. However, the invention is not limited thereto. Furthermore, in the embodiment, the fixing rod 1668 also passes through the hole 142, which also can support the bracket body 162. In other words, the fixing rod 1668 can be structurally integrated into the rod part 1662 (e.g. by taking the fixing rod 1668 as the rod part 1662). In addition, in the embodiment, the resilient holding part 1666 and the fixing rod 1668 (cooperating with the screw part 1670) can make the second end portion 162b fixed relative to the second rack rail 14 independently, so in an application, they can be used alternatively. For example, when only the fixing rod 1668 and the screw part 1670 are used, the bracket 16 is installed on the second rack rail 14 by the fixing rod 1668 of the second connection device 166 being inserted into the hole 142 of the second rack rail 14 and the screw part 1670 being screwed to the fixing rod 1668 for be fixed on the second rack rail 14.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A bracket, for use in an equipment rack, the equipment rack comprising a first rack rail and a second rack rail, the first rack rail having a first hole, the bracket comprising:
    a bracket body having a first end portion and a second end portion, the bracket body having an invariable length;
    a first connection device fixed on the first end portion, the first connection device comprising a first rod part protruding in a first extension direction relative to the bracket body, an engaging section and a supporting section being formed on the first rod part in the first extending direction, the engaging section being located between the supporting section and the first end portion, the bracket being installed on the first rack rail by the supporting section of the first rod part of the first connection device being supported by a perimeter of the first hole, the engaging section being located out of the first hole as the first connection device is supported through the supporting section by the perimeter of the first hole; and
    a second connection device fixed on the second end portion, the bracket being installed on the second rack rail by the second connection device being engaged with the second rack rail;
wherein the bracket body is operable to move relative to the first rack rail and the second rack rail, so that the engaging section enters the first hole to make the second connection device be disengaged from the second rack rail.

2. The bracket of claim 1, wherein the second connection device comprises a resilient holding part, and the second connection device holds the second rack rail by the resilient holding part.

3. The bracket of claim 2, the second rack rail having a second hole, wherein the second connection device comprises a second rod part protruding in a second extension direction relative to the bracket body, and the bracket is installed on the second rack rail by the second rod part of the second connection device being inserted into the second hole.

4. The bracket of claim 3, wherein a length in which the first rod part protrudes relative to the bracket body is larger than a length in which the second rod part protrudes relative to the bracket body.

5. The bracket of claim 3, the second rack rail having a third hole, wherein the resilient holding part comprises a cantilever part, the cantilever part has a fixed end and a free end, the fixed end is fixed on the bracket body, the free end protrudes beyond the bracket body in a second extension direction, and the resilient holding part passes through the third hole by the free end and holds the second rack rail.

6. The bracket of claim 5, wherein the first connection device comprises a first fixed portion fixed on the bracket body, the first rod part is connected to the first fixed portion, the first fixed portion has a first positioning structure, the bracket body has a third positioning structure, and the first positioning structure is engaged with the third positioning structure.

7. The bracket of claim 6, wherein the first positioning structure is a protruding spot or a plurality of positioning slots, the third positioning structure is a plurality of positioning slots or a protruding spot correspondingly, and the protruding spot is snapped in one of the positioning slots.

8. The bracket of claim 5, wherein the second connection device comprises a second fixed portion fixed on the bracket body, the second rod part is connected to the second fixed portion, the bracket body comprises a plurality of second joining holes, the second fixed portion has a second fixing hole, and the second fixing hole is selectively aligned with one of the second joining holes so that the second fixed portion is fixed on the bracket body.

9. The bracket of claim 8, wherein the bracket body comprises two side walls and a top wall, the two side walls are oppositely disposed, the top wall is connected between the two side walls, the two side walls and the top wall form an accommodating space therebetween, the first fixed portion, the second fixed portion, and the fixed end are disposed in the accommodating space, one of the two side walls has a protrusive supporting structure in the accommodating space, the first fixed portion is located between the top wall and the protrusive supporting structure, and the protrusive supporting structure is against the first fixed portion.

10. The bracket of claim 9, wherein the bracket body comprises a bottom wall, the bottom wall is disposed opposite to the top wall and connected to one of the two side walls, and the bottom wall is against the second fixed portion.

11. The bracket of claim 9, wherein each side wall has a protrusive connecting structure in the accommodating space, and the two protrusive connecting structures are fixedly connected to each other.

12. The bracket of claim 1, the second rack rail having a hole, wherein the second connection device comprises a fixing rod and a screw part, the fixing rod protrudes in a second extension direction relative to the bracket body, and the bracket is installed on the second rack rail by the fixing rod of the second connection device being inserted into the hole of the second rack rail and the screw part being screwed to the fixing rod.

13. The bracket of claim 1, wherein the first connection device comprises a first fixed portion fixed on the bracket body, the first rod part is connected to the first fixed portion, the bracket body comprises a plurality of first joining holes, the first fixed portion has a first fixing hole, and the first joining hole is selectively aligned with one of the first joining holes so that the first fixed portion is fixed on the bracket body.

14. The bracket of claim 1, the second rack rail having a second hole, wherein the second connection device comprises a second rod part protruding in a second extension direction relative to the bracket body, the bracket is supported on the second rack rail by the second rod part of the second connection device being inserted into the second hole, and a length in which the first rod part protrudes relative to the bracket body is larger than a length in which the second rod part protrudes relative to the bracket body.

15. An equipment rack, comprising:
    a first rack rail having a first hole;
    a second rack rail; and
    a bracket, comprising:
        a bracket body having a first end portion and a second end portion, the bracket body having an invariable length;
        a first connection device fixed on the first end portion, the first connection device comprising a first rod part protruding in a first extension direction relative to the bracket body, an engaging section and a supporting section being formed on the first rod part in the extending direction, the engaging section being located between the supporting section and the first end portion, the bracket being installed on the first rack rail by the supporting section of the first rod part of the first connection device being supported by a perimeter of the first hole, the engaging section being located out of the first hole as the first connection device is supported through the supporting section by the perimeter of the first hole; and a second connection device fixed on the second end portion, the bracket being installed on the second rack rail by the second connection device being engaged with the second rack rail;

wherein the bracket body is operable to move relative to the first rack rail and the second rack rail, so that the engaging section enters the first hole to make the second connection device be disengaged from the second rack rail.

16. The equipment rack of claim 15, wherein the first connection device comprises a first fixed portion fixed on the bracket body, the first rod part is connected to the first fixed portion, the bracket body comprises a plurality of first joining holes, the first fixed portion has a first fixing hole, and the first fixing hole is selectively aligned with one of the first joining holes so that the first fixed portion is fixed on the bracket body.

17. The equipment rack of claim 16, wherein the bracket body comprises two side walls and a top wall, the two side walls are oppositely disposed, the top wall is connected between the two side walls, the two side walls and the top wall form an accommodating space, the first fixed portion is disposed in the accommodating space, one of the two side walls has a protrusive supporting structure in the accommodating space, the first fixed portion is located between the top wall and the protrusive supporting structure, and the protrusive supporting structure is against the first fixed portion.

18. The equipment rack of claim 15, wherein the second rack rail has a second hole, the second connection device comprises a second rod part protruding in a second extension direction relative to the bracket body, the bracket is supported on the second rack rail by the second rod part of the second connection device being inserted into the second hole, and a length in which the first rod part protrudes relative to the bracket body is larger than a length in which the second rod part protrudes relative to the bracket body.

* * * * *